(12) United States Patent
Udagawa

(10) Patent No.: US 6,531,716 B2
(45) Date of Patent: Mar. 11, 2003

(54) GROUP-III NITRIDE SEMICONDUCTOR LIGHT-EMITTING DEVICE AND MANUFACTURING METHOD FOR THE SAME

(75) Inventor: Takashi Udagawa, Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/838,338

(22) Filed: Apr. 20, 2001

(65) Prior Publication Data

US 2001/0036678 A1 Nov. 1, 2001

Related U.S. Application Data

(60) Provisional application No. 60/263,237, filed on Jan. 23, 2001.

(30) Foreign Application Priority Data

Apr. 21, 2000 (JP) ........................................ 2000-121370

(51) Int. Cl.[7] .............................................. H01L 33/00
(52) U.S. Cl. ......................... 257/94; 257/103; 257/102; 257/79
(58) Field of Search .......................... 257/94, 103, 99, 257/102, 79

(56) References Cited

U.S. PATENT DOCUMENTS 6,130,147 A * 10/2000 Major et al. ................. 438/604
6,194,744 B1 * 2/2001 Udawaga et al. ............. 257/94
6,201,823 B1 * 3/2001 Kimura et al. ................ 372/46

FOREIGN PATENT DOCUMENTS

JP 02-275682 A 11/1990
JP 11-040850 A 2/1999

* cited by examiner

Primary Examiner—Richard Elms
Assistant Examiner—Brad Smith
(74) Attorney, Agent, or Firm—Sughrue Mion, PLLC

(57) ABSTRACT

An n-side-up type group III nitride semiconductor light-emitting device fabricated from an epitaxial wafer having group III nitride semiconductor crystal layers with different crystal structures, i.e., cubic and hexagonal systems. A buffer layer of a boron phosphide (BP) based material, a cubic p-type single crystal layer of a BP based material, a cubic p-type group III nitride semiconductor crystal layer, and a hexagonal n-type group III nitride semiconductor crystal layer are successively formed on a substrate of a p-type conduction Si single crystal. The temperatures for the formation of the above-mentioned buffer layer, cubic p-type group III nitride semiconductor crystal layer, and a hexagonal n-type group III nitride semiconductor crystal layer are desirably in preferred ranges.

8 Claims, 1 Drawing Sheet

GROUP-III NITRIDE SEMICONDUCTOR LIGHT-EMITTING DEVICE AND MANUFACTURING METHOD FOR THE SAME

CROSS REFERENCE TO RELATED APPLICATIONS

This application is an application filed under 35 U.S.C. §111(a) claiming benefit pursuant to 35 U.S.C. §119(e)(1) of the filing date of Provisional Application No. 60/263,237 filed on Jan. 23, 2001 pursuant to 35 U.S.C. §111(b).

FIELD OF THE INVENTION

The present invention relates to a technique for fabricating a group III nitride semiconductor light-emitting device such as an n-side-up light-emitting diode (LED) or a laser diode through the use of an epitaxial wafer wherein a group III nitride semiconductor crystal layer is provided over a p-type silicon (Si) single crystal with a crystal layer comprising a boron phosphide (BP) based material interposed therebetween.

BACKGROUND OF THE INVENTION

With respect to an epitaxial wafer, which is aimed for the production of group III nitride semiconductor light-emitting devices provided with a group III nitride semiconductor crystal layer, a prior art method for fabricating an epitaxial wafer by using a conductive cubic crystal of Si or the like as a substrate and forming thereon a layer of a group III nitride semiconductor, that is, an $Al_xGa_yIn_zN$ ($0 \leq X \leq 1$, $0 \leq Y \leq 1$, $0 \leq Z \leq 1$, $X+Y+Z=1$.) (Japanese Laid-Open Patent Application No. 11-40850) is known. If a cubic crystal of Si or the like having a diamond structure or a cubic crystal of gallium phosphide (GaP) or the like having a zinc blend structure is used as a substrate, a side plane of a lightemitting device can be easily obtained due to the cleavage properties of the cubic crystal. Further, using a low-resistance p-type or n-type conduction Si single crystal as a substrate, another advantage is that an electrode can be formed easily.

In order to provide a group III nitride semiconductor crystal layer having good crystallinity with few crystal defects on a Si single crystal substrate by reducing the lattice mismatch with the Si single crystal, a technique for forming, on the Si single crystal layer, a BP crystal layer as an underlying layer on which the group III nitride semiconductor crystal layer is formed (Japanese Laid-Open Patent Application No. 11-162848) is disclosed. In addition, on a crystal layer comprising BP having a zinc blend crystal structure, a cubic p-type group III nitride semiconductor layer with a lower resistance compared with a hexagonal crystal is more likely to be formed because of the band structure (Japanese Laid-Open Patent Application No. 2-275682). Such a low-resistance cubic p-type group III nitride semiconductor crystal layer is advantageous for easily fabricating a light-emitting portion with a p-n junction type double hetero (DH) structure of a light-emitting device.

On the other hand, however, a group III nitride semiconductor crystal layer has a tendency to become a hexagonal crystal layer due to its low formation energy. (Refer to the following book written and edited by Isamu Akasaki: "Group III Nitride Semiconductor," Baifukan Co., Ltd., p. 37, Dec. 8, 1999, first edition.) For this reason, even though using a crystal layer composed of cubic BP as an underlying layer and forming thereon a cubic group III nitride semiconductor crystal layer is intended, once a group III nitride semiconductor crystal layer becomes so thick that the effects thereon of the crystal structure of the underlying layer are weak, a hexagonal group III nitride semiconductor crystal layer is prone to grow. Therefore, a problem that low-resistance p-type group III nitride semiconductor crystal layer, which could be produced with ease when using the characteristics of the band structure of a cubic crystal, cannot be formed consistently as the layer gets thicker exists.

LEDs using a group III nitride semiconductor are broadly divided into the p-side-up type and n-side-up type depending on the layered structures. The p-side-up type LED is an LED wherein an n-type substrate is located at a lower part thereof and an upper cladding layer located above a light-emitting layer comprises a p-type crystal layer. Conversely, the n-side-up type LED refers to an LED wherein a p-type substrate is located at a lower part thereof and an upper cladding layer comprising an n-type crystal layer is disposed above a light-emitting layer. In the n-side-up type LED, the upper cladding layer or a current diffusion layer located thereon is made of an n-type compound semiconductor layer generally having a larger mobility compared with a p-type compound semiconductor layer, and therefore the n-side-up type LED is inherently advantageous for diffusing a device operation current into the light-emitting portion over a wide range. That is, the n-side-up type LED has an advantageous structure for easily obtaining a high-brightness group III nitride semiconductor light-emitting device.

In view of the foregoing, an object of the present invention is to overcome the conventional technical issues and provide a technique of fabricating an n-side-up type group III nitride semiconductor light-emitting device having high brightness. More specifically, in fabricating an n-side-up type group III nitride semiconductor light-emitting device by using an epitaxial wafer comprising a group III nitride semiconductor crystal layer provided over a p-type Si single crystal substrate via a crystal layer comprising a BP based material, the present invention provides a technique for fabricating the n-side-up type group III nitride semiconductor light-emitting device by appropriately combining a cubic group III nitride semiconductor crystal layer, which is advantageous for forming a low-resistance p-type layer, and a hexagonal n-type group III nitride semiconductor crystal layer, which can be easily formed. Further, the present invention provides an n-side-up type group m nitride semiconductor light-emitting device fabricated from an epitaxial wafer, which comprises group III nitride semiconductor crystal layers having different crystal structures, i.e., cubic and hexagonal forms.

SUMMARY OF THE INVENTION

The present invention provides a group III nitride semiconductor light-emitting device comprising a substrate comprising a p-type conduction silicon (Si) single crystal, a buffer layer comprising a boron phosphide (BP) based material, which is provided on the substrate, a cubic p-type single crystal layer comprising a BP based material, which is provided on the buffer layer in contact therewith, a cubic p-type group III nitride semiconductor crystal layer, which is provided on the p-type single crystal layer in contact therewith, and a hexagonal n-type group III nitride semiconductor crystal layer provided on the p-type group III nitride semiconductor crystal layer.

In particular, in the present invention, the above-mentioned p-type group III nitride semiconductor crystal layer preferably has a thickness of about 10 nanometer (nm)

or more and about 500 nm or less. Further, a dopant for the p-type group III nitride semiconductor crystal layer is preferably at least one selected from a group consisting of zinc (Zn), magnesium (Mg), and carbon (C).

In accordance with the present invention, the above-mentioned cubic p-type group III nitride semiconductor crystal layer and hexagonal n-type group III nitride semiconductor crystal layer are intended to be used for a light-emitting portion of the group III nitride semiconductor light-emitting device.

Further, the present invention provides a method of manufacturing a group III nitride semiconductor light-emitting device comprising the step of successively providing a buffer layer comprising a BP based material, a cubic p-type single crystal layer comprising a BP based material, a cubic p-type group III nitride semiconductor crystal layer, and a hexagonal n-type group III nitride semiconductor crystal layer, in order on a substrate comprising a p-type conduction Si single crystal, wherein the p-type single crystal layer is provided at a temperature higher than the temperature used for providing the buffer layer.

In particular, in the present invention, the temperature for providing the buffer layer is preferably in the range of about 300° C. to about 400° C.

Further, in the present invention, the temperature for providing the cubic p-type group III nitride semiconductor crystal layer is preferably in the range of about 800° C. to about 1000° C.

Still further, in the present invention, the temperature for providing the hexagonal n-type group III nitride semiconductor crystal layer is preferably about 1000° C. or more.

DESCRIPTION OF THE PREFERRED EMBODIMENTS

Figure 1:
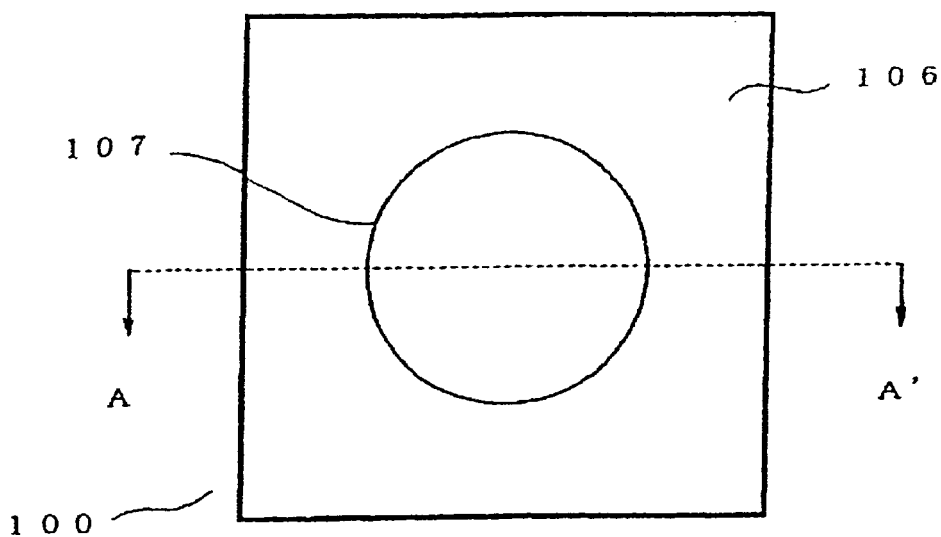
FIG. 1 is a schematic plan view of an LED according to an example of the present invention.

In accordance with an embodiment of the present invention, an epitaxial wafer is fabricated using a p-type Si single crystal as a substrate. A p-type Si single crystal doped with boron (B), which has a crystal face orientation of {100} or {111}, can be used as a substrate. Using the {100}-Si single crystal as a substrate has the advantage that the substrate can be easily divided into individual devices through the use of its cleavage property. On the other hand, using the {111}-Si single crystal as a substrate has an advantage that a crystal layer of a BP based material with good adhesion can be formed on the surface of the substrate.

First, a buffer layer comprising a BP based material is provided on the surface of the above-mentioned p-type Si single crystal substrate. Here, the BP based material is a material that contains at least boron (B) and phosphorus (P) as constituent elements. In addition to boron phosphide (BP), boron phosphide nitride (composition formula: $BP_XN_{1-X}$, where $0<X<1$) and boron arsenide phosphide (composition formula: $BAs_{1-X}P_X$, where $0<X<1$) are included in the BP based material. A crystal layer comprising such a BP based material can be provided by halogen or hydride vapor phase epitaxy (VPE) method. Alternatively, the structure can be formed by the metal organic chemical vapor deposition (MOCVD) method. Preferably, the buffer layer of the BP based material is mainly composed of the amorphous material in the as-grown state for efficiently reducing the lattice mismatch, which makes up as much as about 17% of the BP single crystal layer and the Si single crystal substrate, and for forming a cubic p-type single crystal layer comprising the BP based material over the Si single crystal substrate via the buffer layer of the BP based material. Hence the temperature for providing the buffer layer of the BP based material is preferably as low as about 300° C. to about 400° C. regardless of the foregoing crystal growth methods. Further, the thickness of the above-mentioned buffer layer may be in the range of about 5 nm to about 50 nm. When the buffer layer is thicker than about 15 nm, it is desirable that this buffer layer be converted to a p-conduction-type layer by doping with p-type impurities.

The buffer layer comprising the BP based material becomes a polycrystalline or amorphous layer after the cubic p-type single crystal layer comprising a BP based material is provided thereon.

The cubic p-type single crystal layer comprising the BP based material is grown in contact with the buffer layer mentioned above. The foregoing buffer layer reduces the lattice mismatch between the Si single crystal substrate and the p-type single crystal layer, and serves as an underlying layer which allows for formation of a p-type single crystal layer having good crystallinity with a small crystal defect density such as misfit dislocations. In addition, when a cubic p-type single crystal layer comprising the BP based material is provided on the buffer layer, the above-mentioned buffer layer serves as a function layer, which prevents the peeling of the p-type single crystal layer from the substrate.

The fact that a Si single crystal and a p-type single crystal layer comprising a BP based material are cubic crystals acts advantageously for providing a cubic group III nitride semiconductor crystal layer thereon. Further, the group III nitride semiconductor crystal layer formed in contact with the p-type single crystal layer comprising the BP based material becomes a zinc blend cubic crystal layer.

In accordance with the present invention, a p-type single crystal layer is disposed over the p-type Si single crystal substrate via the aforementioned buffer layer. The p-type single crystal layer comprising the BP based material can be provided by any of the above-mentioned typical VPE methods using a source material such as boron trichloride ($BCl_3$), phosphorous trichloride ($PCl_3$), diborane ($B_2H_6$), or phosphine ($PH_3$). Alternatively, the p-type single crystal layer comprising the BP based material may be provided by the MOCVD method using a source material such as triethylboron ($(C_2H_5)_3B$) or $PH_3$. By doping p-type impurities while providing the single crystal layer comprising the BP based material, a p-type single crystal layer can be formed. Preferable examples of the p-type impurities include zinc (Zn) and magnesium (Mg). It is preferable that the p-type carrier concentration be about $5\times10^{17}$ cm$^{-3}$ or more and about $5\times10^{19}$ cm$^{-3}$ or less. For a single crystal layer having a high carrier concentration exceeding about $5\times10^{19}$ cm$^{-3}$, the surface flatness is lost as a general rule, and therefore it is disadvantageous for forming thereon a layer having a good surface flatness.

In contrast to the buffer layer comprising the BP based material as mentioned above, a p-type single crystal layer comprising the BP based material is formed from a single crystal. This single crystal layer can be obtained by setting a temperature higher than that for the formation of the buffer layer. For example, a crystal growth from vapor of a p-type single crystal layer with the MOCVD method under normal pressure (atmospheric pressure) using $(C_2H_5)_3B$ and $PH_3$ as raw material gases and $H_2$ as an ambient gas, a single crystal layer can be obtained when the temperature is set in the range of about 500° C. to about 850° C.

Preferably, the thickness of the above-mentioned p-type single crystal layer is in the range of about 50 nm to about 5 μm.

Here, for example, the lattice constant of a zinc blend structure cubic BP crystal is 4.538 Å which is substantially equal to the lattice constant (=4.510 Å) of a cubic gallium nitride (GaN) crystal that is one of the group III nitride semiconductors, and therefore the lattice mismatch therebetween is small. Accordingly, a cubic GaN crystal layer having good crystallinity with few crystal defects can grow on a single crystal layer composed of cubic BP. Thus, by adjusting the composition of the cubic p-type single crystal layer comprising the BP based material and the composition of the cubic p-type group m nitride semiconductor crystal layer so that the lattice mismatch at the interface is reduced, it becomes possible to form a p-type group III nitride semiconductor crystal layer having good crystallinity with few crystal defects in contact with the p-type single crystal layer.

Generally, an n-type conduction layer and a p-type conduction layer can be easily formed from the cubic group III nitride semiconductor due to its band structure. Because of this, a low-resistance p-type group III nitride semiconductor crystal layer can be formed more easily compared with a hexagonal group III nitride semiconductor crystal layer. A cubic p-type group III nitride semiconductor crystal layer can be formed by doping with at least one selected from a group consisting of a group II element, such as zinc (Zn) or magnesium (Mg), and a group IV element such as carbon (C), during the formation. In order to provide a cubic p-type group III nitride semiconductor crystal layer, it is advantageous to control the temperature so that it is in the range of about 800° C. to about 1000° C. which is lower compared with when a hexagonal group III nitride semiconductor crystal layer is provided. The cubic p-type group III nitride semiconductor crystal layer of the present invention preferably has a carrier concentration of about $1 \times 10^{17}$ cm$^{-3}$ or more and a resistivity of about 10 ohm·centimeter (Ω·cm) or less. The above-mentioned p-type group III nitride semiconductor crystal layer can be formed by molecular beam epitaxy (MBE) method, as well as the aforementioned means for vapor phase growth.

Even when a cubic group III nitride semiconductor crystal layer is provided on the p-type single crystal layer of a cubic BP based material, as the group III nitride semiconductor crystal layer becomes thicker, the hexagonal crystal form tends to become predominant in the aforementioned crystal layer. An extremely thick group III nitride semiconductor crystal layer becomes a crystal layer where cubic and hexagonal crystals exist in a mixed state, and it becomes impossible to obtain a group III nitride semiconductor crystal layer mainly composed of cubic crystals. Accordingly, in order to obtain a cubic group III nitride semiconductor crystal layer, the thickness thereof may be about 500 nm or less, preferably about 200 nm or less. A cubic p-type group III nitride semiconductor crystal layer can be used, for example, as a p-type cladding layer which constitutes a light-emitting portion with a p-n junction type double hetero (DH) structure. When using the p-type group III nitride semiconductor crystal layer as the p-type cladding layer, it is preferable that the crystal layer has a thickness of about 10 nm or more in order to sufficiently exhibit the carrier cladding effect.

A hexagonal group III nitride semiconductor crystal layer can be formed on the cubic group III nitride semiconductor crystal layer using any vapor growth method such as the VPE method and the MOCVD method. The hexagonal group III nitride semiconductor crystal layer can be efficiently formed by setting the temperature at about 1000° C. or more which is higher than the temperature used for providing the cubic group III nitride semiconductor crystal layer regardless of the vapor growth method. In this case, however, the temperature for providing the hexagonal group III nitride semiconductor crystal layer should be the temperature where the effect of the sublimation of the crystals is negligible. The hexagonal group III nitride semiconductor crystal layer may be provided over the cubic group III nitride semiconductor crystal layer with other layers (e.g., a light-emitting layer) interposed therebetween.

Whether the group III nitride semiconductor crystal layer is cubic or hexagonal can be determined by its diffraction pattern obtained by common X-ray diffraction analysis, electron diffraction analysis, or the like. Further, with X-ray diffraction analysis, the relative proportion of the cubic crystal or the hexagonal crystal (weight ratio) can be determined from the X-ray diffraction intensity ratio. Here, the cubic group III nitride semiconductor crystal layer and the hexagonal group III nitride semiconductor crystal layer refer to crystal layers containing at least about 80 wt. % of cubic crystal and hexagonal crystal, respectively. In other words, each layer is mainly composed of cubic crystal or hexagonal crystal.

An n-type cladding layer having a p-n junction type DH structure can be more advantageously made from the hexagonal n-type group III nitride semiconductor crystal layer than from the cubic one. For example, the band gap width of hexagonal GaN having a wurtzite structure is about 3.4 electronvolt (eV), while the band gap width of cubic GaN is about 3.2 eV. Accordingly, when the n-type group III nitride semiconductor crystal layer is composed of hexagonal crystals, it is advantageous that a cladding layer be formed, which has a higher hetero-barrier to the light-emitting layer, and therefore can produce the carrier cladding effect more efficiently. The hexagonal n-type group III nitride semiconductor crystal layer can be obtained even in an undoped state. However, by doping with silicon (Si), sulfur (S), or selenium (Se), which is well known as an n-type impurity during the deposition, an n-type crystal layer with a controlled carrier concentration and resistivity can be formed. The proper carrier concentration of the n-type group III nitride semiconductor crystal layer as a cladding layer is about $1 \times 10^{18}$ cm$^{-3}$ or more. Further, the thickness of the n-type group III nitride semiconductor crystal layer is preferably about 50 nm or more and about 5 μm or less.

The group III nitride semiconductor light-emitting device of the present invention is provided with a cubic p-type group III nitride semiconductor crystal layer and a hexagonal n-type group III nitride semiconductor crystal layer, which are located on a p-type Si single crystal substrate via a buffer layer comprising a BP based material and a p-type single crystal layer comprising a BP based material. The group III nitride semiconductor light-emitting device is fabricated from an epitaxial wafer in which both the cubic p-type group III nitride semiconductor crystal layer and the hexagonal n-type group III nitride semiconductor crystal layer are used for a light-emitting portion of a p-n junction type double hetero (DH) structure. An n-side-up type light-emitting device can be fabricated by forming a p-type ohmic electrode on the back side of the p-type Si single crystal substrate of this epitaxial wafer, forming an n-type ohmic electrode on the epitaxial layer of the wafer, and then dividing the epitaxial wafer into individual devices. In this case, the p-type ohmic electrode may be made of, for example, aluminum (Al), gold (Au), or alloys of Al or Au, while the n-type ohmic electrode for the n-type group III nitride semiconductor crystal layer may be composed of, for example, Au or an Au alloy.

The buffer layer comprising a BP based material provided on the Si single crystal substrate for use in the present invention has the effect of enhancing the adhesion between the p-type single crystal layer comprising a BP based material located on the buffer layer and the Si single crystal substrate. Further, the buffer layer also has an effect of reducing the lattice mismatch between the Si single crystal substrate and the p-type single crystal layer comprising a BP based material, which allows the formation of a p-type single crystal layer having good crystallinity.

In the present invention, the p-type group III nitride semiconductor crystal layer having good crystallinity with few crystal defects can be formed on the p-type single crystal layer by adjusting the composition of the p-type single crystal layer and p-type group III nitride semiconductor crystal layer so as to reduce the lattice mismatch at an interface between the p-type single crystal layer comprising a BP based material and the cubic p-type group III nitride semiconductor crystal layer. Further, the cubic p-type single crystal layer has the effect of efficiently providing a cubic p-type group III nitride semiconductor crystal layer.

Further, in the present invention, a p-type cladding layer of the light-emitting portion is formed of the cubic group III nitride semiconductor crystal layer while an n-type cladding layer is formed of the hexagonal group III nitride semiconductor crystal layer, which allows for the fabrication of a p-n junction type DH structure light-emitting portion having the p-type cladding layer with low resistivity and the n-type cladding layer having a high carrier cladding effect.

EXAMPLES

The group III nitride semiconductor light-emitting device according to the present invention will now be explained in more detail with reference to the following example. The present invention is not intended to be limited by the example, which should not be construed as limiting the scope of the invention. Unless indicated otherwise herein, all parts, percents, ratios and the like are by weight.

Figure 2:
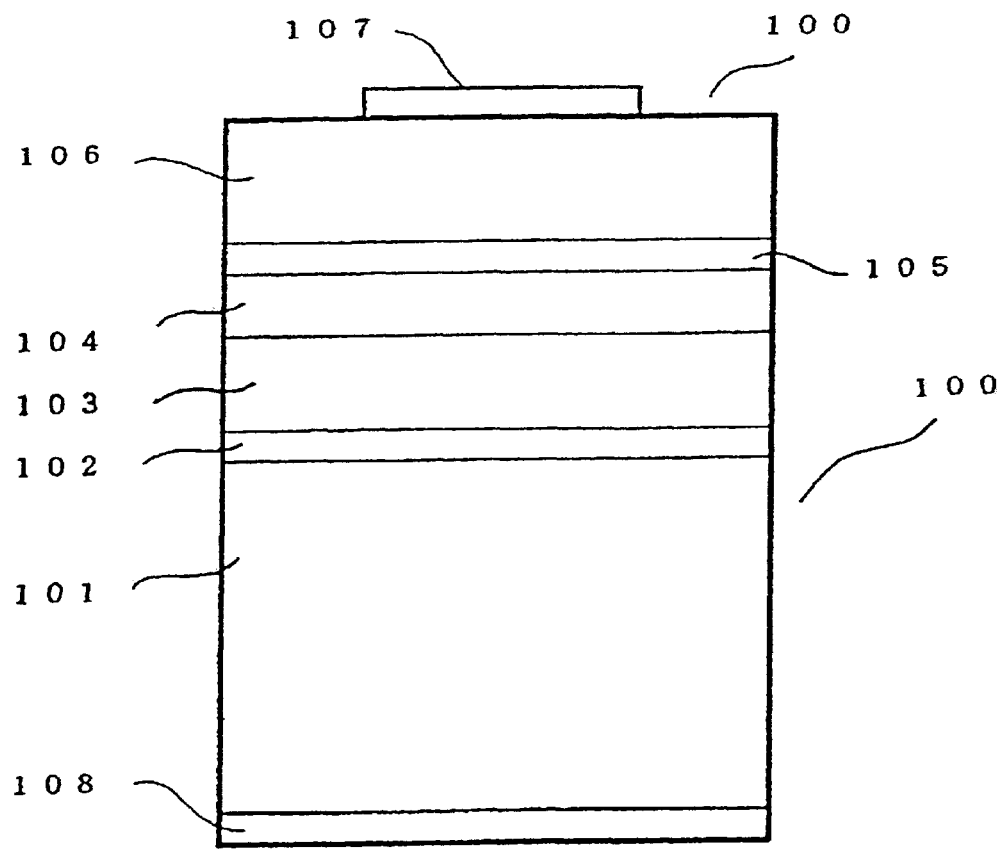
FIG. 2 is a schematic sectional view of the LED taken along the broken line A–A' of FIG. 1.

FIG. 1 is a schematic plan view of an LED 100 according to the example of the present invention wherein a p-type Si single crystal substrate is used and a group III nitride semiconductor layer constitutes a light-emitting portion. Further, FIG. 2 is a schematic sectional view of the LED 100 taken along the broken line A–A' of FIG. 1.

First, an epitaxial wafer was fabricated by providing a substrate 101 of a p-type Si single crystal, a buffer layer 102 of BP, a cubic p-type single crystal layer 103 of BP, a cubic p-type GaN layer 104, a light-emitting layer 105 comprising gallium indium nitride, and a hexagonal n-type GaN layer 106, which are described under the items (1) to (6) below.

(1) A substrate 101 made of a Si single crystal having a p-type (100) surface doped with boron (B).

(2) A Zn-doped p-type buffer layer 102 comprising amorphous boron phosphide (BP), having a thickness of about 20 nm. Triethylboron (($C_2H_5)_3$B) and phosphine ($PH_3$) were used as the source materials with a supply ratio (V/III ratio) of $PH_3$ to $(C_2H_5)_3$B set to about 100 and grown at a temperature of 350° C. by the MOCVD method in an ambient of hydrogen ($H_2$) under atmospheric pressure.

(3) A Zn-doped p-type single crystal layer 103 comprising cubic BP, having a carrier concentration of about $2 \times 10^{18}$ $cm^{-3}$ and a thickness of about 1 $\mu$m. This layer was deposited on the above-mentioned buffer layer 102 at a temperature of about 550° C. by the MOCVD method using dimethylzinc $((CH_3)_2Zn)$ as the Zn doping source.

(4) A Mg-doped cubic p-type GaN layer 104 having a carrier concentration of about $1 \times 10^{18}$ $cm^{-3}$ and a thickness of about 50 nm. Trimethylgallium $((CH_3)_3Ga)$ and ammonia ($NH_3$) were used as the source materials and grown at a temperature of 880° C. by the MOCVD method in an ambient of $H_2$ under atmospheric pressure.

(5) A light-emitting layer 105 comprising an n-type gallium indium nitride mixed crystal ($Ga_{0.88}In_{0.12}N$), having a thickness of about 12 nm. $(CH_3)_3Ga$, cyclopentadienylindium (I) ($C_5H_5In(I)$), and $NH_3$ were used as the source materials and grown at 880° C. by the MOCVD method in an ambient of $H_2$ under atmospheric pressure, thereby forming a multi-phase structure composed of a plurality of phases having different indium compositions with the average indium (In) composition ratio of about 0.15.

(6) A hexagonal n-type GaN layer 106 having a carrier concentration of about $3 \times 10^{17}$ $cm^{-3}$ and a thickness of about 1.5 $\mu$m. $(CH_3)_3Ga$ and $NH_3$ were used as the source materials and grown at a temperature of 1080° C. by the MOCVD method in an ambient of $H_2$ under atmospheric pressure.

The LED 100 was fabricated from the epitaxial wafer mentioned above. Here, the cubic p-type GaN layer 104, the light-emitting layer 105, and the hexagonal n-type GaN layer 106 constitute a p-n junction type DH structure light-emitting portion of the LED 100, wherein the p-type GaN layer 104 and the n-type GaN layer 106 serve as a p-type cladding layer and an n-type cladding layer, respectively.

The above-mentioned epitaxial wafer was analyzed by the cross-sectional TEM method using a transmission electron microscope (TEM) and the X-ray diffraction method. As a result, the p-type GaN layer 104 showed a diffraction due to the zinc blend structure cubic crystals. Further, the p-type GaN layer 104 became a crystal layer having a high carrier (hole) concentration and a resistivity of as low as about 1 $\Omega \cdot cm$.

The LED 100 was fabricated by forming n-type and p-type ohmic electrodes 107 and 108, shown below, on the above-mentioned epitaxial wafer using the conventional photolithographic technology.

(7) An n-type ohmic electrode 107 composed of gold (Au) in a circular form having a diameter of about 130 $\mu$m was formed on the n-type GaN layer 106 located at the uppermost position.

(8) A p-type ohmic electrode 108 composed of aluminum (Al) was formed over the substantially entire back surface of the Si single crystal substrate 101.

Then, the epitaxial wafer provided with the ohmic electrodes 107 and 108 was divided into individual devices (chips) with conventional scribing means by using the cleavage property in the [110] orientation of the Si single crystal of the substrate 101. The planar shape of the chip was about 350 $\mu$m square.

An operating current was applied in a forward direction between the n-type and p-type ohmic electrodes 107 and 108 to allow for the light emission of the LED 100 and the following light emission properties were obtained:
  (a) emission wavelength=460 nm;
  (b) luminous intensity=1.0 candera (cd);
  (c) forward voltage=3.6 volts (V) (where the forward current=20 mA); and
  (d) reverse voltage=20 V or more (where the reverse current=10 $\mu$A).

In particular, in the present example, the p-type GaN layer 104 was disposed in conjunction with the p-type single crystal layer 103 comprising cubic BP, whereby it was possible for the p-type GaN layer to become a low-resistance cubic crystal layer, as mentioned above. As a result, the LED 100 made it possible to reduce the forward voltage more than conventional LEDs.

In accordance with the present invention, the cubic p-type group III nitride semiconductor crystal layer is formed in conjunction with the single crystal layer comprising a BP based material with a zinc blend structure over the p-type Si single crystal substrate so that the p-type group III nitride semiconductor crystal layer tends to have low resistance. In addition, an n-type cladding layer of a light-emitting portion having a p-n junction type double hetero (DH) structure can be formed by the hexagonal n-type group III nitride semiconductor crystal layer, and therefore a high-brightness n-side-up type group III nitride semiconductor light-emitting device can be fabricated.

While the invention has been described in detail and with reference to specific embodiments thereof, it will be apparent to one skilled in the art that various changes and modifications can be made therein without departing from the spirit and scope thereof.

What is claimed is:

1. A group III nitride semiconductor light-emitting device, comprising: a substrate comprising a p-type conduction silicon (Si) single crystal; a buffer layer comprising a boron phosphide (BP) based material which is provided on said substrate; a cubic p-type single crystal layer comprising a BP-based material which is provided on said buffer layer; a cubic p-type group III nitride semiconductor crystal layer which is provided on said p-type single crystal layer in contact therewith; and a hexagonal n-type group III nitride semiconductor crystal layer; wherein both of said cubic p-type group III nitride semiconductor crystal layer and said hexagonal n-type group III crystal layer comprise Ga.

2. The group III nitride semiconductor light-emitting device as claimed in claim 1, wherein said cubic p-type group III nitride semiconductor crystal layer has a thickness in a range of 10 nm to 500 nm.

3. The group III nitride semiconductor light-emitting device as claimed in claim 1 or 2, wherein a dopant for said cubic p-type group III nitride semiconductor crystal layer is at least one selected from a group consisting of zinc (Zn), magnesium (Mg), and carbon (C).

4. The group III nitride semiconductor light-emitting device as claimed in claim 1 or 2, wherein said cubic p-type group III nitride semiconductor crystal layer and said hexagonal n-type group III nitride semiconductor crystal layer are present on a light-emitting portion.

5. A method of manufacturing a group III nitride semiconductor light-emitting device comprising: a substrate comprising a p-type conduction silicon (Si) single crystal; a buffer layer comprising a boron phosphide (BP) based material which is provided on said substrate; a cubic p-type single crystal layer comprising a BP-based material which is provided on said buffer layer a cubic p-type group III nitride semiconductor crystal layer, which is provided on said p-type single crystal layer in contact therewith; and a hexagonal n-type group III nitride semiconductor crystal layer; wherein both of said cubic p-type group III nitride semiconductor crystal layer and said hexagonal n-type group III crystal layer comprise Ga, said method comprising the step of successively providing a buffer layer comprising a boron phosphide (BP) based material on said substrate, a cubic p-type single crystal layer comprising a BP-based material on said buffer layer, a cubic p-type group III nitride semiconductor crystal layer, on said p-type single crystal layer in contact therewith; and a hexagonal n-type group III nitride semiconductor crystal layer, and forming said cubic p-type single crystal layer at a temperature higher than a temperature used for forming said buffer layer.

6. The method of manufacturing said group III nitride semiconductor light-emitting device as claimed in claim 5, wherein said buffer layer is formed at a temperature in a range of 300° C. to 400° C.

7. The method of manufacturing said group III nitride semiconductor light-emitting device as claimed in claim 5 or 6, wherein said cubic p-type group III nitride semiconductor crystal layer is formed at a temperature in a range of 800° C. to 1000° C.

8. The method of manufacturing said group III nitride semiconductor light-emitting device as claimed in claim 5 or 6, wherein said hexagonal n-type group III nitride semiconductor crystal layer is formed at a temperature of 1000° C. or more.

* * * * *